(12) United States Patent
Koezuka

(10) Patent No.: US 8,324,084 B2
(45) Date of Patent: Dec. 4, 2012

(54) MANUFACTURING METHOD OF SEMICONDUCTOR SUBSTRATE AND MANUFACTURING METHOD OF SEMICONDUCTOR DEVICE

(75) Inventor: Junichi Koezuka, Atsugi (JP)

(73) Assignee: Semiconductor Energy Laboratory Co., Ltd., Atsugi-shi, Kanagawa (JP)

( * ) Notice: Subject to any disclaimer, the term of this patent is extended or adjusted under 35 U.S.C. 154(b) by 69 days.

(21) Appl. No.: 13/072,150

(22) Filed: Mar. 25, 2011

(65) Prior Publication Data
US 2011/0244660 A1 Oct. 6, 2011

(30) Foreign Application Priority Data
Mar. 31, 2010 (JP) ................. 2010-084075

(51) Int. Cl.
*H01L 21/322* (2006.01)
(52) U.S. Cl. . 438/474; 438/473; 438/475; 257/E21.317; 257/E21.318; 257/E21.319; 257/E21.32
(58) Field of Classification Search ................. None
See application file for complete search history.

(56) References Cited

U.S. PATENT DOCUMENTS

| 6,372,609 B1 | 4/2002 | Aga et al. | |
| 2002/0164842 A1* | 11/2002 | Nakajima | 438/149 |
| 2008/0245406 A1 | 10/2008 | Yamazaki et al. | |
| 2008/0251126 A1 | 10/2008 | Yamazaki et al. | |
| 2008/0261376 A1* | 10/2008 | Yamazaki et al. | 438/406 |
| 2010/0087044 A1 | 4/2010 | Shichi et al. | |

FOREIGN PATENT DOCUMENTS

| JP | 2000-124092 | 4/2000 |
| JP | 2010-109345 | 5/2010 |

\* cited by examiner

*Primary Examiner* — Charles Garber
*Assistant Examiner* — Yasser Abdelaziez
(74) *Attorney, Agent, or Firm* — Eric J. Robinson; Robinson Intellectual Property Law Office, P.C.

(57) ABSTRACT

An object is to provide a manufacturing method of a semiconductor substrate provided with a single crystal semiconductor layer with a surface having a high degree of flatness. Another object is to manufacture a semiconductor device with high reliability by using the semiconductor substrate provided with a single crystal semiconductor layer with a high degree of flatness. In a manufacturing process of a semiconductor substrate, a thin embrittled region containing a large crystal defect is formed in a single crystal semiconductor substrate at a predetermined depth by subjecting the single crystal semiconductor substrate to a rare gas ion irradiation step, a laser irradiation step, and a hydrogen ion irradiation step. Then, by performing a separation heating step, a single crystal semiconductor layer that is flatter on a surface side than the embrittled region is transferred to a base substrate.

6 Claims, 6 Drawing Sheets

MANUFACTURING METHOD OF SEMICONDUCTOR SUBSTRATE AND MANUFACTURING METHOD OF SEMICONDUCTOR DEVICE

BACKGROUND OF THE INVENTION

1. Field of the Invention

The present invention relates to a manufacturing method of a semiconductor substrate provided with a single crystal semiconductor layer over an insulating surface and a manufacturing method of a semiconductor device.

2. Description of the Related Art

As an alternative to an integrated circuit using a silicon wafer which is manufactured by thinly slicing an ingot of a single crystal semiconductor, an integrated circuit using a semiconductor substrate that is referred to as a silicon-on-insulator (hereinafter also referred to as "SOI") substrate, in which a thin single crystal semiconductor layer is provided on an insulating surface has been developed. The integrated circuit using an SOI substrate has attracted attention as an integrated circuit which reduces parasitic capacitance between a drain of a transistor and the substrate and improves the performance of a semiconductor integrated circuit.

As a method of manufacturing an SOI substrate, a hydrogen ion implantation separation method is known (for example, see Patent Document 1). In the hydrogen ion implantation separation method, hydrogen ions are added to a silicon wafer surface to form a microbubble region at a predetermined depth from the surface, and then the silicon wafer surface is bonded to another silicon wafer. By further performing a heat treatment, hydrogen ions that are distributed in the silicon wafer become concentrated in the microbubble region, and by the microbubble region becoming a cleaved surface and a silicon layer on a surface side getting separated at the cleaved surface, the separated thin silicon layer can be transferred the silicon wafer to which it is bonded.

REFERENCE

Patent Document

[Patent Document 1] Japanese Published Patent Application No. 2000-124092

SUMMARY OF THE INVENTION

To form a high performance semiconductor integrated circuit using a semiconductor substrate provided with a single crystal semiconductor layer, a surface of the single crystal semiconductor layer that is provided needs to have a high degree of flatness.

In view of such a problem, an object is to provide a manufacturing method of a semiconductor substrate provided with a single crystal semiconductor layer with a surface having a high degree of flatness, which can withstand actual use as a semiconductor substrate over which a high performance semiconductor integrated circuit is formed.

Another object is to manufacture a semiconductor device with high reliability by using a semiconductor substrate provided with a single crystal semiconductor layer with a high degree of flatness.

By subjecting a single crystal semiconductor substrate to a rare gas ion irradiation step, a laser irradiation step, and a hydrogen ion irradiation step, a thin embrittled region containing a large crystal defect is formed in the single crystal semiconductor substrate at a predetermined depth, and by performing a separation heating step, the single crystal semiconductor layer that is on a surface side than the embrittled region is transferred to a base substrate.

Note that a damaged region in this specification refers to a region in which a defect is caused in a crystal structure by rare gas ion irradiation, and an embrittled region in this specification refers to a damaged region that includes enough hydrogen ions that would cause a separation phenomenon at a cleaved surface by volume expansion in a separation heating step.

First, a rare gas ion irradiation step is performed on a surface of a single crystal semiconductor substrate to form a damaged region in the single crystal semiconductor substrate. When rare gas ions are irradiated to inside of the single crystal semiconductor substrate, damage that is caused to a crystal structure is severe; accordingly, a large crystal defect can be formed efficiently.

Also, since a rare gas is inactive, it is not necessary to control a gaseous atmosphere or temperature during work and a high level of safety can be given as an advantage.

In the rare gas ion irradiation step that is performed to form the damaged region, a rare gas that has reached a depth according to incidence energy is contained inside the single crystal semiconductor substrate with a concentration distribution. The distribution of this rare gas is broad and has a high concentration. Accordingly, since the damage region depends on the concentration distribution of the rare gas that is contained, the damage region in the single crystal semiconductor is formed in a manner that is thick in a periphery of a predetermined depth.

When a step of separating the single crystal semiconductor layer from a single crystal semiconductor substrate is attempted to be performed at the damaged region, since the damaged region is distributed widely (thickly) in a depth (film thickness) direction and separation occurs over a large area, the cleaved surface does not become a flat surface when transferring the single crystal semiconductor layer to another base substrate and a large asperity is formed.

Therefore, to make the damaged region in the single crystal semiconductor substrate thin in the film thickness direction, the laser irradiation step is performed from a surface of the single crystal semiconductor substrate. By performing laser irradiation, a crystal defect that is caused by the rare gas ion irradiation is restored, and the damaged region can be made thin in the film thickness direction.

Since energy of a laser can be adjusted with high precision, just an area from the surface of the single crystal semiconductor substrate to a predetermined depth that is the cleaved surface can be selectively heated. By this heating, the area from the surface of the single crystal semiconductor substrate to the predetermined depth that is the cleaved surface is melted and re-single-crystallization is performed.

With this, the crystal defect of the damaged region that is shallower than the predetermined depth can be restored to make the damaged region thin in the film thickness direction, while maintaining the crystal defect of the damaged region at the predetermined depth.

Note that since energy of a laser can be adjusted with high precision, thickness of the damaged region in the film thickness direction can be controlled with high precision.

Next, a hydrogen ion irradiation step is performed on a surface of the single crystal semiconductor substrate to form an embrittled region inside the single crystal semiconductor substrate. Since the damaged region is already formed by the rare gas ion irradiation step, hydrogen ions that are emitted tend to concentrate in the damaged region, and the embrittled region can be formed efficiently with a low ion concentration.

Since there is no need to perform hydrogen ion irradiation at a high concentration, crystal defect that is formed in the single crystal semiconductor substrate can be controlled.

Furthermore, since a platelet defect can be formed in the single crystal semiconductor substrate by irradiation of hydrogen ions, separation can be done at a low temperature.

Next, a base substrate, which is for bonding with the single crystal semiconductor layer that is on a surface side than the cleaved surface, is attached. To increase attachment strength between the base substrate and the single crystal semiconductor substrate, a surface of the base substrate preferably has a high degree of flatness.

Lastly, a separation heating step is performed to separate the singe crystal semiconductor layer that is on the surface side than the cleaved surface.

In this manner, by forming the damaged region with a thin film thickness containing a large crystal defect by performing the rare gas ion irradiation step and the laser irradiation step, and then forming the embrittled region by performing the hydrogen ion irradiation step on the damaged region, the embrittled region with a thin film thickness containing a large crystal defect can be formed. Accordingly, the cleaved surface that is obtained after the separation heating step has a high degree of flatness with little asperity.

One aspect of a manufacturing method of a semiconductor substrate of the present invention is a manufacturing method of a semiconductor substrate including steps of forming a first damaged region by emitting rare gas ions to a surface of a single crystal semiconductor substrate; forming a second damaged region by emitting a laser light to the surface of the single crystal semiconductor substrate to melt a portion of the first damaged region; forming an embrittled region at a certain depth from the surface of the single crystal semiconductor substrate by emitting hydrogen ions to the second damaged region from the surface of the single crystal semiconductor substrate; and forming a single crystal semiconductor layer over a base substrate from the single crystal semiconductor substrate by performing a heat treatment to separate the single crystal semiconductor substrate at the embrittled region by having the embrittled region serve as a cleaved surface, while the single crystal semiconductor substrate and the base substrate are superimposed over each other.

Another aspect of the manufacturing method of the semiconductor substrate of the present invention is a manufacturing method of a semiconductor substrate including steps of: forming a first damaged region by emitting rare gas ions to a surface of a single crystal semiconductor substrate; forming a second damaged region by emitting a first laser light to the surface of the single crystal semiconductor substrate to melt a portion of the first damaged region; melting a region from the surface of the single crystal semiconductor substrate to the embrittled region by emitting a second laser light to the single crystal semiconductor substrate; forming an embrittled region at a certain depth from the surface of the single crystal semiconductor substrate by emitting hydrogen ions to the second damaged region from the surface of the single crystal semiconductor substrate; and forming a single crystal semiconductor layer over a base substrate from the single crystal semiconductor substrate by performing a heat treatment to separate the single crystal semiconductor substrate at the embrittled region by having the embrittled region serve as a cleaved surface, while the single crystal semiconductor substrate and the base substrate are superimposed over each other.

Another aspect of the manufacturing method of the semiconductor substrate of the present invention is a manufacturing method of a semiconductor wherein helium is used as a rare gas.

One aspect of a manufacturing method of a semiconductor device of the present invention is a manufacturing method of a semiconductor device, wherein a semiconductor element is formed using the single crystal semiconductor layer formed by the manufacturing method of a semiconductor substrate described above.

By subjecting a single crystal semiconductor substrate to a rare gas ion irradiation step, a laser irradiation step, and a hydrogen ion irradiation step to form a thin embrittled region with a large crystal defect in the single crystal semiconductor substrate at a predetermined depth, a cleaved surface that is obtained after a separation heating step can be made to have a high degree of flatness with little asperity.

Since the embrittled region can be formed efficiently with little hydrogen ion irradiation by forming a thin damaged region by rare gas ion irradiation and laser irradiation before performing hydrogen ion irradiation, a crystal defect that is formed in the single crystal semiconductor substrate by hydrogen ion irradiation can be controlled.

By using a single crystal semiconductor layer with a high degree of flatness that is separated from such a single crystal semiconductor substrate, various semiconductor devices including high-performance and highly reliable semiconductor elements, memory elements, integrated circuits, or the like can be manufactured with high yield.

DETAILED DESCRIPTION OF THE INVENTION

Figure 1A:
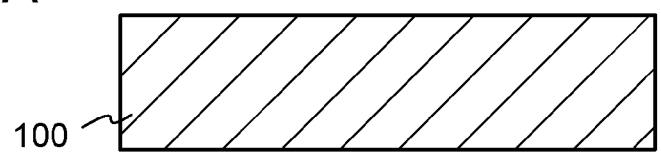
FIGS. 1A to 1E are diagrams illustrating a manufacturing method of a semiconductor substrate.

Embodiments of the present invention will be described below with reference to the accompanying drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in the structure of the present invention described below, portions that are identical or portions having similar functions in different drawings are denoted by the same reference numerals, and their repetitive description will be omitted.

Embodiment 1

This embodiment describes a manufacturing method of a semiconductor substrate provided with a single crystal semiconductor layer with a cleaved surface having a high degree of flatness, which can withstand actual use as a semiconductor substrate over which a high performance semiconductor integrated circuit is formed.

First, a single crystal semiconductor substrate 100 is prepared (see FIG. 1A). Note that although a semiconductor substrate of a single crystal is used here, a substrate having a layer of a single crystal may be also used.

As the single crystal semiconductor substrate 100, for example, a single crystal semiconductor substrate that is formed of an element belonging to Group 14, such as a single crystal silicon substrate, a single crystal germanium substrate, or a single crystal silicon germanium substrate, can be used. Further, a compound semiconductor substrate using gallium arsenide, indium phosphide, or the like can be used. A commercially available silicon substrate is typically a circular substrate with a 5-inch (125 mm) diameter, a 6-inch (150 mm) diameter, an 8-inch (200 mm) diameter, a 12-inch (300 mm) diameter, or a 16-inch (400 mm) diameter. Note that the shape of the single crystal semiconductor substrate 100 is not limited to a circular shape, and the single crystal semiconductor substrate 100 may be a substrate that is processed into a rectangular shape or the like, for example. Further, the single crystal semiconductor substrate 100 can be manufactured by a Czochralski (CZ) method or a Floating Zone (FZ) method.

Figure 1B:
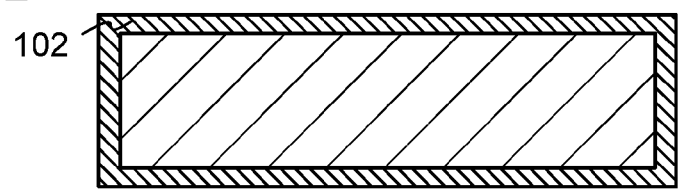

Next, an insulating layer 102 is formed over a surface of the single crystal semiconductor substrate 100 (see FIG. 1B). Note that, from a point of view of contaminant removal, it is preferable that the surface of the single crystal semiconductor substrate 100 be cleaned with hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before forming the insulating layer 102. Alternatively, cleaning may be performed by alternately discharging dilute hydrofluoric acid and ozone water.

The insulating layer 102 can be formed, for example, as a single layer of a silicon oxide film, a silicon oxynitride film, or the like, or a laminated layer of these films. As a manufacturing method of the insulating layer 102, a thermal oxidation method, a CVD method, a sputtering method, or the like can be used. When the insulating layer 102 is formed by a CVD method, a silicon oxide film is preferably formed using organosilane such as tetraethoxysilane (abbreviation: TEOS, chemical formula: $Si(OC_2H_5)_4$), to obtain favorable bonding.

In this embodiment, the insulating layer 102 (here, an oxide film (SiOx film)) is formed by performing a thermal oxidation treatment on the single crystal semiconductor substrate 100. The thermal oxidation treatment is preferably performed in an oxidizing atmosphere to which halogen is added.

For example, by performing a thermal oxidation treatment on the single crystal semiconductor substrate 100 in an oxidizing atmosphere to which chlorine (Cl) is added, the insulating layer 102 is formed through chlorine oxidation. In this case, the insulating layer 102 is film containing chlorine atoms. By such chlorine oxidation, a heavy metal (such as Fe, Cr, Ni, Mo, or the like, for example) that is an extrinsic impurity is trapped and a chloride of the metal is formed, which is then removed to the outside, thereby reducing contamination of the single crystal semiconductor substrate 100. Moreover, after it is bonded to a base substrate 200, an impurity such as Na from the base substrate is fixed, and contamination of the single crystal semiconductor substrate 100 can be prevented.

Note that the halogen atoms contained in the insulating layer 102 are not limited to chlorine atoms. The insulating layer 102 may contain fluorine atoms. As a method of performing fluorine oxidation on the surface of the single crystal semiconductor substrate 100, there is a method in which the single crystal semiconductor substrate 100 is soaked in an HF solution and then subjected to a thermal oxidation treatment in an oxidizing atmosphere, a method in which the thermal oxidation treatment is performed in an oxidizing atmosphere to which $NF_3$ is added, or the like.

Figure 1C:
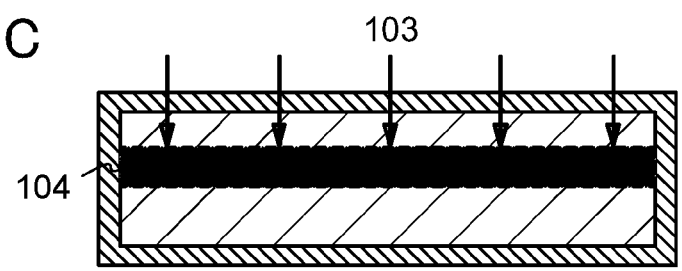

Next, a rare gas ion irradiation 103 is performed to a surface of the single crystal semiconductor substrate 100. By accelerating rare gas ions by an electric field and emitting them to the single crystal semiconductor substrate 100, a first damaged region 104 where a crystal structure is damaged is formed in the single crystal semiconductor substrate 100 at a predetermined depth (see FIG. 1C).

The depth at which the first damaged region 104 is formed can be controlled by kinetic energy, mass, charge or incidence angle of the ions, or the like. Moreover, the first damaged region 104 is formed in a region that is at a depth approximately equal to an average penetration depth of the ions. Therefore, a thickness of a single crystal semiconductor layer that is to be separated from the single crystal semiconductor substrate 100 can be controlled by the depth to which the ions are emitted. For example, the average penetration depth may be controlled so that the thickness of the single crystal semiconductor layer is about 10 nm or more and 500 nm or less, preferably 50 nm or more and 200 nm or less.

The above ion irradiation treatment can be performed using an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, the ion-implantation apparatus is a mass-separation apparatus. In the ion-implantation apparatus, mass separation of ion species in plasma is performed and the object to be processed is irradiated with ion species having predetermined masses.

In this embodiment, as the rare gas ion irradiation, an example of irradiating the single crystal semiconductor substrate 100 with helium (He) gas using the ion-doping apparatus will be described.

When helium is used as a source gas, a damaged region can be formed by performing irradiation with an acceleration voltage in a range of 10 kV to 100 kV, and a dose in a range of $1\times10^{15}$ ions/cm$^2$ to $5\times10^{16}$ ions/cm$^2$. By using helium as the source gas, He ions can be emitted as main ions without performing mass separation.

When rare gas ions such as helium ions are emitted to the single crystal semiconductor substrate, the helium that is added knocks out (casts out) silicon atoms in a silicon crystal lattice and the first damaged region with a crystal defect is formed. Since rare gas ions are large in size and heavy in weight, they easily form a large defect, and separation is easy even if a thickness of the damaged region is made thin.

Also, since helium is an inert gas, gas atmosphere control and temperature control are easy during ion irradiation, thereby improving work efficiency and safety.

Note that the rare gas ions to be emitted are not limited to helium ions, and argon ions or the like may be emitted. Furthermore, the rare gas ions to be emitted are not limited to one kind, and multiple kinds of ions may be added.

Note that although there is concern that a heavy metal may also be added when the first damaged region 104 is formed using an ion-doping apparatus, by performing ion irradiation through the insulating layer 102 containing halogen atoms, contamination of the single crystal semiconductor substrate 100 by such heavy metal can be prevented.

Note that after helium irradiation, a heat treatment may be performed on the first damaged region to concentrate helium in the first damaged region. A temperature of this heat treatment is to be a temperature at which a void, which is due to release of helium from inside the single crystal semiconductor substrate, does not get formed (for example, 200° C. or higher and lower than 600° C.). The heat treatment can be performed using a diffusion furnace, a heating furnace such as a resistance heating furnace, a rapid thermal annealing (RTA) apparatus, a microwave heating apparatus, or the like. Note that the above temperature condition is merely an example, and an embodiment of the disclosed invention should not be construed as being limited to this example.

Figure 1D:
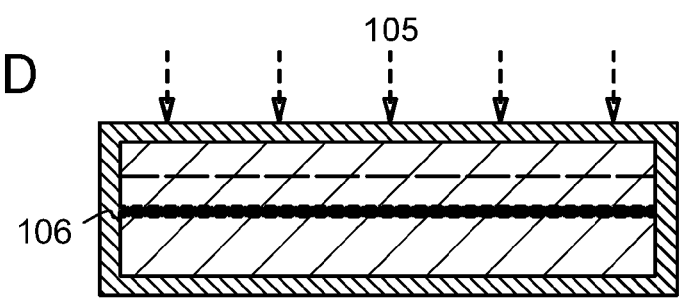

Next, by emitting a laser light 105 to the surface of the single crystal semiconductor substrate to selectively melt an irradiation region that includes a depth direction of the single crystal semiconductor substrate and perform re-single-crystallization, the crystal defect in a portion of the first damaged region that is close to a surface side of the single crystal semiconductor substrate is restored. With this, a second damaged region 106 with reduced thickness is formed (see FIG. 1D).

Next, a hydrogen ion irradiation 107 is performed to the surface of the single crystal semiconductor substrate. By accelerating hydrogen ions by an electric field and emitting them to the single crystal semiconductor substrate 100, hydrogen ions are distributed in a periphery of the second damaged region 106 at a high concentration, thereby forming an embrittled region 108, which generates a separation phenomenon by concentration of hydrogen gas during a separation heating treatment (see FIG. 1E).

The above ion irradiation treatment can be performed using an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, the ion-implantation apparatus is a mass-separation apparatus. In the ion-implantation apparatus, mass separation of ion species in plasma is performed and the object to be processed is irradiated with ion species having predetermined masses.

In this embodiment, an example is described in which the single crystal semiconductor substrate 100 is irradiated with hydrogen ions using the ion-doping apparatus. A gas containing hydrogen is used as a source gas. As for ions used for the irradiation, a proportion of $H_3^+$ is preferably set high. Specifically, it is preferable that the proportion of $H_3^+$ be 50% or higher (more preferably, 80% or higher) with respect to the total amount of $H^+$, $H_2^+$, and $H_3^+$. With a high proportion of $H_3^+$, the efficiency of ion irradiation can be improved.

The second damaged region 106 containing a crystal defect is already formed by helium irradiation, and an embrittled region 108 can be formed efficiently at a low ion concentration since hydrogen ions that are emitted tend to gather in the second damaged region 106; accordingly, crystal defect that is formed in the single crystal semiconductor substrate by the hydrogen ion irradiation can be suppressed.

Note that, since a platelet defect can be formed in the single crystal semiconductor substrate by emitting hydrogen ions, separation can be done at a low temperature.

Regarding concentration distribution of hydrogen that is contained, it is preferable to perform irradiation in a manner that forms a hydrogen concentration peak near a center of the second damaged region 106 with respect to a film thickness direction; however, it is not limited thereto, since hydrogen ions tend to gather in the second damaged region 106.

Note that although there is concern that a heavy metal may also be added when the a high-concentration ion distribution region is formed using an ion-doping apparatus, by performing ion irradiation through the insulating layer 102 containing halogen atoms, contamination of the single crystal semiconductor substrate 100 by such heavy metal can be prevented.

Also, a heat treatment for restoring a crystal defect may be performed after the hydrogen ion irradiation. A temperature of this heat treatment is to be a temperature at which separation due to hydrogen concentration in the embrittled region 108 does not occur (for example, 200° C. or higher and lower than 400° C.). The heat treatment can be performed using a diffusion furnace, a heating furnace such as a resistance heating furnace, a rapid thermal annealing (RTA) apparatus, a microwave heating apparatus, or the like. Note that the above temperature condition is merely an example, and an embodiment of the disclosed invention should not be construed as being limited to this example.

Next, the base substrate 200 is prepared. A substrate made of an insulator can be used as the base substrate 200. Specifically, various glass substrates that are used in the electronics industry, such as those made of aluminosilicate glass, aluminoborosilicate glass, and barium borosilicate glass; and a quartz substrate can be given.

In this embodiment, a case of using a glass substrate as the base substrate 200 will be described. By using as the base substrate 200 a glass substrate, which is inexpensive and can be made to have a large area, cost can be reduced.

Regarding the base substrate 200, a surface thereof is preferably cleaned in advance. Specifically, the base substrate 200 is subjected to ultrasonic cleaning using hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like. By performing such a cleaning treatment, flatness of a surface of the base substrate 200 can be improved and abrasive particles remaining on the surface of the base substrate 200 can be removed.

Note that, a barrier layer for preventing an impurity such as sodium (Na) contained in the base substrate from diffusing into the single crystal semiconductor layer may be formed over the surface of the base substrate 200.

Figure 2A:
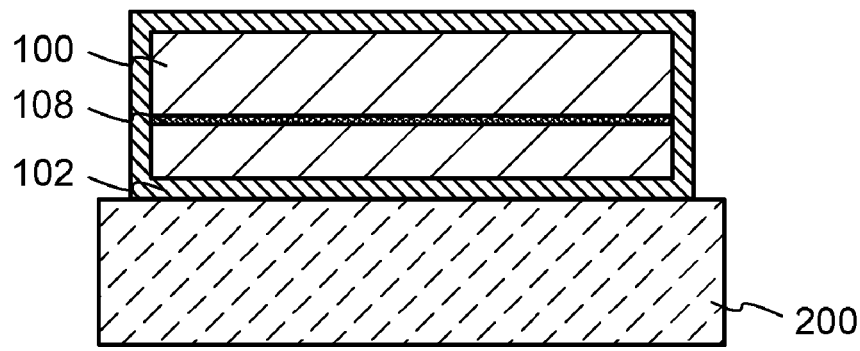
FIGS. 2A to 2C are diagrams illustrating a manufacturing method of a semiconductor substrate.

Next, the single crystal semiconductor substrate 100 and the base substrate 200 are made to face each other, and a surface of the insulating layer 102 and a surface of the base substrate 200 are firmly attached together. With this, the single crystal semiconductor substrate 100 and the base substrate 200 are bonded together (see FIG. 2A).

When bonding is performed, it is desirable to apply pressure of 0.001 N/cm$^2$ or higher and 100 N/cm$^2$ or lower, for example 1 N/cm$^2$ or higher and 20 N/cm$^2$ or lower, to a portion of the base substrate 200 or the single crystal semiconductor substrate 100. When bonding surfaces are made to be close to each other and firmly attached to each other by applying pressure, bonding occurs between the base substrate 200 and the insulating layer 102 in the portion that is firmly attached, and bonding voluntarily spreads to almost the entire surface with this portion as a starting point. This bonding is performed under an action of the Van der Waals force or hydrogen bonding and can be performed at room temperature.

Note that before the single crystal semiconductor substrate 100 and the base substrate 200 are bonded together, surfaces to be bonded together are preferably subjected to a surface treatment. By performing a surface treatment, bonding strength at an interface between the single crystal semiconductor substrate 100 and the base substrate 200 can be improved.

As the surface treatment, a wet treatment, a dry treatment, or a combination of the wet treatment and the dry treatment can be used. Alternatively, a wet treatment may be used in combination with a different wet treatment or a dry treatment may be used in combination with a different dry treatment.

Note that after bonding, a heat treatment for increasing bonding strength may be performed. A temperature of this heat treatment is to be set at a temperature at which separation at the embrittled region 108 does not occur (for example, 200° C. or higher and lower than 400° C.). Further, while heating in this temperature range, the insulating layer 102 and the base substrate 200 may be bonded. The heat treatment can be performed using a diffusion furnace, a heating furnace such as a resistance heating furnace, a rapid thermal annealing (RTA) apparatus, a microwave heating apparatus, or the like. Note that the above temperature condition is merely an example, and an embodiment of the disclosed invention should not be construed as being limited to this example.

Figure 2B:
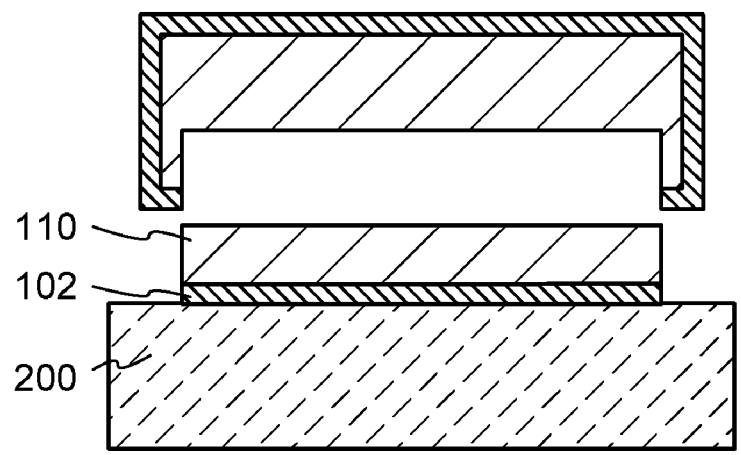

Next, by performing a separation heating treatment, the single crystal semiconductor substrate 100 is separated at the embrittled region, and a single crystal semiconductor layer 110 is separated over to the base substrate 200 with the insulating layer 102 interposed therebetween (see FIG. 2B). A separation example of FIG. 2B is one example. In a case, the insulating layer 102 is separated along the embrittled region 108.

Figure 2C:
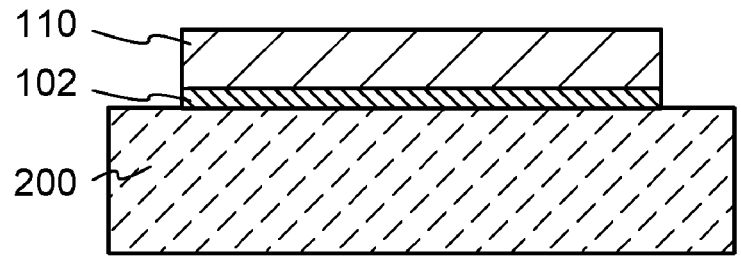

By the above steps, the single crystal semiconductor layer 110 with favorable characteristics of high degree of flatness and little crystal defect can be transferred from the single crystal semiconductor substrate 100 to the base substrate 200, and a semiconductor substrate provided with a single crystal semiconductor layer that can withstand practical use as a semiconductor substrate over which a high performance semiconductor integrated circuit is formed can be obtained (see FIG. 2C).

Note that a temperature of the heat treatment in performing the above separation is desirably as low as possible. This is because the lower the temperature in performing the separation, the more a surface roughness of the single crystal semiconductor layer 110 can be suppressed. Specifically for example, the temperature of the heat treatment for performing the above separation is 300° C. or higher and 600° C. or lower, and preferably, it is even more effective if the temperature is 300° C. or higher and 500° C. or lower.

Note that after the single crystal semiconductor substrate 100 is separated, the single crystal semiconductor layer 110 may be subjected to a heat temperature of 100° C. or higher to reduce concentration of hydrogen that remains in the single crystal semiconductor layer 110.

By manufacturing a semiconductor element such as a transistor from the single crystal semiconductor layer 110 provided over the base substrate, film thickness of a gate insulating layer can be reduced and a localized interface state density of the gate insulating layer can be reduced. Furthermore, by making the film thickness of the single crystal semiconductor layer 110 to be thin, a transistor of a complete depletion type can be formed over the base substrate using a single crystal semiconductor layer.

Moreover, in this embodiment, when a single crystal silicon substrate is used as the single crystal semiconductor substrate 100, a single crystal silicon layer can be obtained as the single crystal semiconductor layer 110. Also, a manufacturing method of the semiconductor method according to this embodiment permits a processing temperature to be 700° C. or lower; consequently, a glass substrate can be applied as the base substrate 200. That is, similarly to a conventional thin film transistor, a transistor can be formed over a glass substrate, and a single crystal silicon layer can be used as the single crystal semiconductor layer. Accordingly, a high-performance and highly-reliable transistor that can be driven at high speed, which has a low sub-threshold value, a high field effect mobility, and low consumption voltage, can be manufactured over a base substrate such as a glass substrate.

Note that in the present invention disclosed in this specification, a semiconductor device refers to a device that can function by utilizing a semiconductor characteristic. By using the present invention, a device having a circuit that includes a semiconductor element (a transistor, a memory element, a diode, or the like), and a semiconductor device such as a chip with a processor circuit can be manufactured.

The present invention disclosed in this specification can also be used for a semiconductor device (also referred to as a display device) having a display function. As the semiconductor device, a semiconductor device (light-emitting display device) in which a transistor is connected to a light emitting element in which a layer containing an organic substance, an inorganic substance, or a combination of an organic substance and an inorganic substance which expresses light emission called electroluminescence (hereafter also referred to EL) is interposed between electrodes; a semiconductor device (liquid crystal display device) which uses a liquid crystal element (liquid crystal display element) having a liquid crystal material as a display element; and the like can be given. In this specification, a display device refers to a device having a display element, and a display device also refers to a main body of a display panel in which a plurality of pixels including display elements and a peripheral driver circuit for driving the pixels are formed over a substrate. Further, a flexible printed circuit (FPC) or a printed wiring board (PWB) (such as ICs, resistors, capacitors, inductors, and transistors) may be attached to such a display panel. Also, a display panel may include an optical sheet such as a polarizing plate or a retardation plate. In addition, a display panel may also include a backlight unit (which may include a light guide plate, a prism sheet, a diffusion sheet, a reflection sheet, and a light source (such as LED or a cold cathode tube)).

Note that there are various modes of display elements and semiconductor devices, and various elements can be used. For example, the following can be used: an EL element (an organic EL element, an inorganic EL element, or an EL element containing an organic substance and an inorganic substance), an electron-emissive element, a liquid crystal element, electronic ink, a grating light valve (GLV), a plasma display panel (PDP), a digital micromirror device (DMD), a piezoceramic display, a carbon nanotube, and the like that are display medium in which contrast changes by an electromagnetic effect. Note that a semiconductor device using an EL element may be an EL display; a semiconductor device using an electron-emissive element may be a field emission display (FED), an SED (Surface-conduction Electron-emitter Display) type flat panel display, or the like; a semiconductor device using a liquid crystal element may be a liquid crystal display, a transmissive liquid crystal display, a semi-transmissive liquid crystal display, or a reflective liquid crystal display; and a semiconductor device using electronic ink may be electronic paper.

By using a semiconductor substrate that is manufactured according to the method disclosed in this specification, a high-performance and highly reliable semiconductor substrate and semiconductor device can be manufactured with high yield.

Embodiment 2

This embodiment describes an example in which the step of bonding a single crystal semiconductor layer to a base substrate from a single crystal semiconductor substrate is different from Embodiment 1. Accordingly, descriptions of the same portion or a portion having a similar function to the portions in Embodiment 1 are not repeated.

Figure 1E:
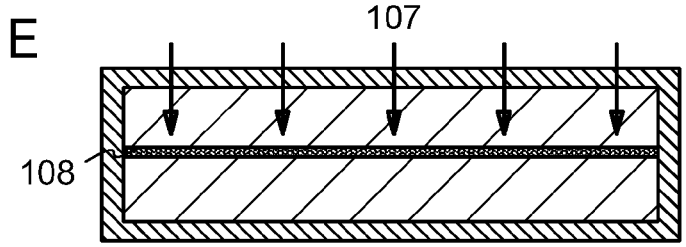
Figure 3A:
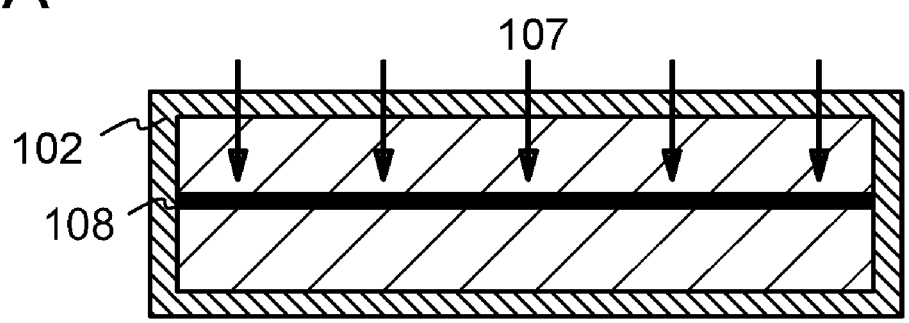
FIGS. 3A and 3B are diagrams illustrating a manufacturing method of a semiconductor substrate.

In this embodiment, in a similar manner to Embodiment 1, the insulating layer 102 is formed over the single crystal semiconductor substrate 100, the embrittled region 108 with a small thickness is formed by a rare gas ion irradiation step, a laser irradiation step, and a hydrogen ion irradiation step, and then a second laser irradiation step is performed to restore a crystal defect, and FIG. 3A corresponds to FIG. 1E.

Figure 3B:
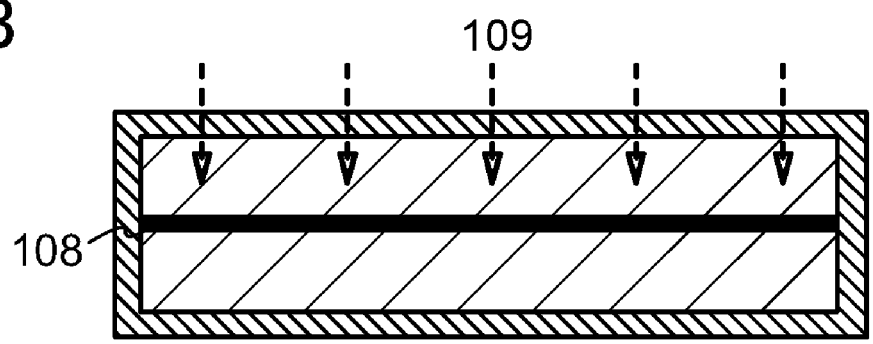

A laser light 109 is emitted to a surface of the single crystal semiconductor substrate 100 in which the embrittled region 108 is formed (see FIG. 3B). With this, just the crystal defect that is in a region that is shallower than the embrittled region 108 can be restored while maintaining the crystal defect in the embrittled region 108. Therefore, by using the single crystal semiconductor layer 110 manufactured according to this embodiment, a semiconductor substrate provided with a single crystal semiconductor layer with extremely little crystal defect in a periphery of a cleaved surface can be manufactured.

This embodiment can be appropriately combined with another embodiment.

Embodiment 3

This embodiment describes a manufacturing method of a CMOS (Complementary Metal Oxide Semiconductor) as an example of a manufacturing method of a semiconductor device over which a semiconductor integrated circuit including a thin and high performance semiconductor element is mounted with high yield, with reference to FIGS. 4A to 4E and FIGS. 5A to 5D. Note that descriptions of the same portion or a portion having a similar function to the portions in Embodiment 1 are not repeated.

Figure 4A:
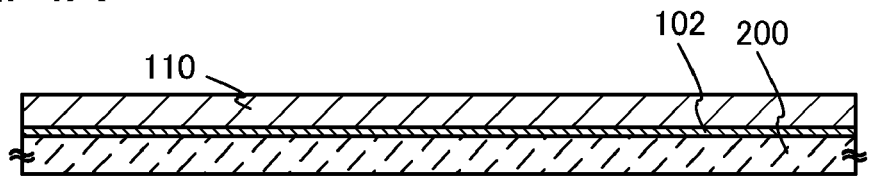
FIGS. 4A to 4E are diagrams illustrating a manufacturing method of a semiconductor device.

In FIG. 4A, the insulating layer 102 and the single crystal semiconductor layer 110 are formed over the base substrate 200. FIG. 4A corresponds to FIG. 2C. Note that here, although an example of employing a semiconductor substrate with a structure shown in FIG. 2C of Embodiment 1 is used, a semiconductor substrate with another structure described in this specification can be employed.

In the single crystal semiconductor layer 110, a p-type impurity such as boron, aluminum, or gallium or an n-type impurity such as phosphorus or arsenic may be added depending on a conductivity type of the separated single crystal semiconductor substrate (an impurity element imparting one conductivity type which is contained) in accordance with a formation region of an n-channel field effect transistor or a p-channel field effect transistor in order to control the threshold voltage. The dose of impurity elements may be approximately $1 \times 10^{12}$ ions/cm$^2$ to $1 \times 10^{14}$ ions/cm$^2$.

Figure 4B:
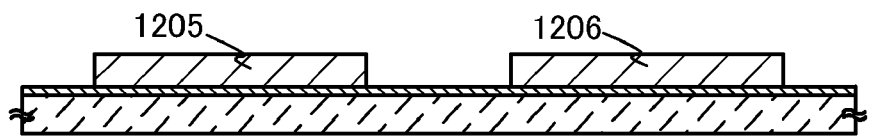

The single crystal semiconductor layer 110 is etched to form single crystal semiconductor layers 1205 and 1206 that are separated into island shapes in a manner that match locations of semiconductor elements (see FIG. 4B).

An oxide film over the single crystal semiconductor layers is removed, and a gate insulating layer 1207 that covers the single crystal semiconductor layers 1205 and 1206 is formed. Since the single crystal semiconductor layers 1205 and 1206 in this embodiment have a high degree of flatness, the gate insulating layer formed over the single crystal semiconductor layers 1205 and 1206 can have good coverage even when it is a thin gate insulating layer. Accordingly, poor characteristic due to poor coverage by the gate insulating layer can be prevented, and a highly reliable semiconductor device can be manufactured with high yield. Reduction in film thickness of the gate insulating layer 1207 has an effect that makes a transistor operate at high speed with a low voltage.

The gate insulating layer 1207 may be formed using silicon oxide or formed to have a laminated structure of silicon oxide and silicon nitride. The gate insulating layer 1207 may be formed by depositing an insulating film by a plasma CVD method or a low-pressure CVD method or may be formed by solid phase oxidation or solid phase nitridation by a plasma treatment. The gate insulating layer that is formed by oxidizing or nitriding the single crystal semiconductor layers by a plasma treatment is dense, and has high dielectric strength voltage and excellent reliability. For example, nitrous oxide ($N_2O$) is diluted with Ar by 1 to 3 times (flow rate) and a microwave (2.45 GHz) with a power of 3 kW to 5 kW is applied at a pressure of 10 Pa to 30 Pa to oxidize or nitride surfaces of the single crystal semiconductor layers 1205 and 1206. By this treatment, an insulating film with a thickness of 1 nm to 10 nm (preferably 2 nm to 6 nm) is formed. Further, nitrous oxide ($N_2O$) and silane ($SiH_4$) are introduced, and a silicon oxynitride film is formed by a vapor deposition method by application of a microwave (2.45 GHz) power of 3 kW to 5 kW at a pressure of 10 Pa to 30 Pa, thereby forming the gate insulating layer. By combining solid-phase reaction and a reaction from a vapor deposition method, a gate insulating layer with a low interface state density and excellent withstand voltage can be formed.

Further, for the gate insulating layer 1207, a high dielectric constant material such as zirconium dioxide, hafnium oxide, titanium dioxide, or tantalum pentoxide may be used. When a high dielectric constant material is used for the gate insulating layer 1207, a gate leakage current can be reduced.

Figure 4C:
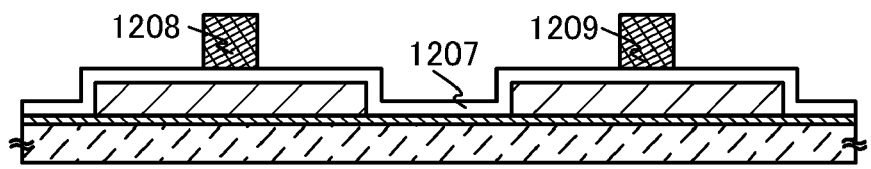
Figure 4D:
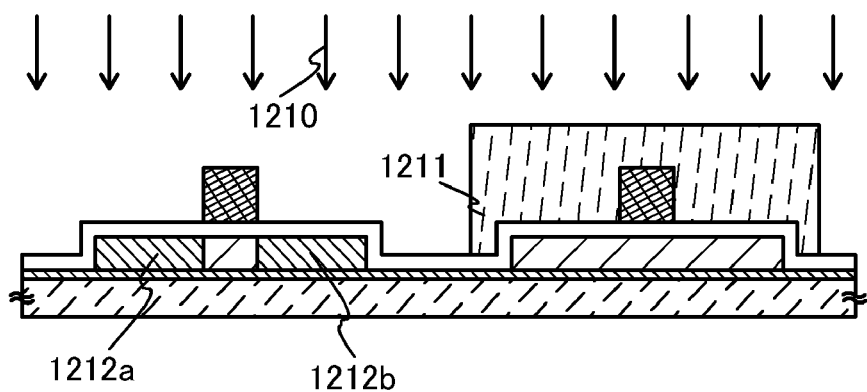
Figure 4E:
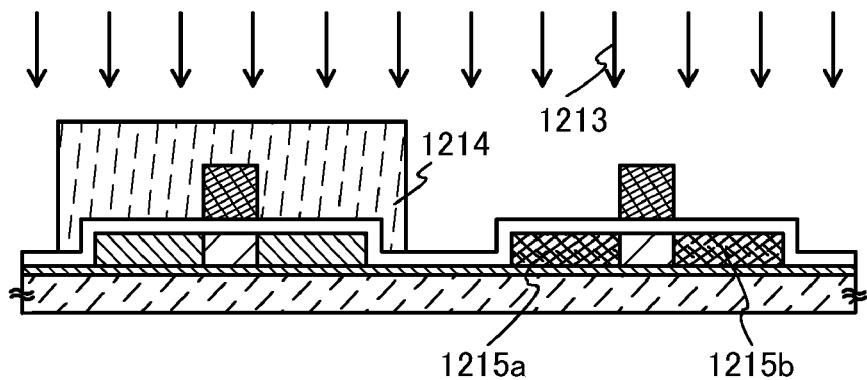

A gate electrode layer 1208 and a gate electrode layer 1209 are formed over the gate insulating layer 1207 (see FIG. 4C). The gate electrode layers 1208 and 1209 can be formed by a sputtering method, an evaporation method, a CVD method, or the like. The gate electrode layers 1208 and 1209 may be formed using an element selected from tantalum (Ta), tungsten (W), titanium (Ti), molybdenum (Mo), aluminum (Al), copper (Cu), chromium (Cr), and neodymium (Nd); or an alloy material or compound material mainly containing the element. Moreover, the gate electrode layers 1208 and 1209 may be formed using a semiconductor film typified by a polycrystalline silicon film doped with an impurity element such as phosphorus, or an AgPdCu alloy.

A mask 1211 that covers the single crystal semiconductor layer 1206 is formed. Using the mask 1211 and the gate electrode layer 1208 as masks, an impurity element 1210 imparting n-type conductivity is added to form first n-type impurity regions 1212a and 1212b (see FIG. 4D). In this embodiment, phosphine ($PH_3$) is used as a doping gas containing an impurity element. Here, the impurity element imparting n-type conductivity is added so that the first n-type impurity regions 1212a and 1212b contain the impurity element at a concentration of about $1 \times 10^{17}$ atoms/cm$^3$ to $5 \times 10^{18}$ atoms/cm$^3$. In this embodiment, phosphorus (P) is used as the impurity element imparting n-type conductivity.

Next, after removing the mask 1211, a mask 1214 that covers the single crystal semiconductor layer 1205 is formed. Using the mask 1214 and the gate electrode layer 1209 as masks, an impurity element 1213 imparting p-type conductivity is added to form first p-type impurity regions 1215a and 1215b (see FIG. 4E). Since boron (B) is used as the impurity element in this embodiment, diborane ($B_2H_6$) or the like is used as a doping gas containing the impurity element.

Figure 5A:
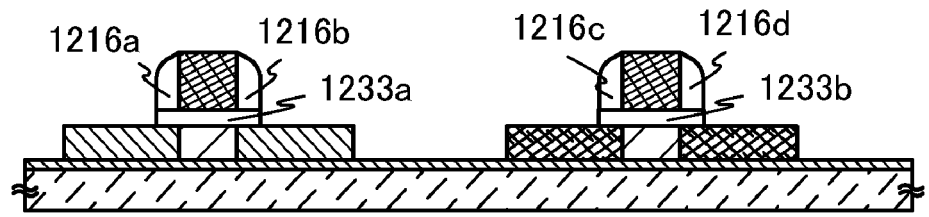
FIGS. 5A to 5D are diagrams illustrating a manufacturing method of a semiconductor device.
Figure 5B:
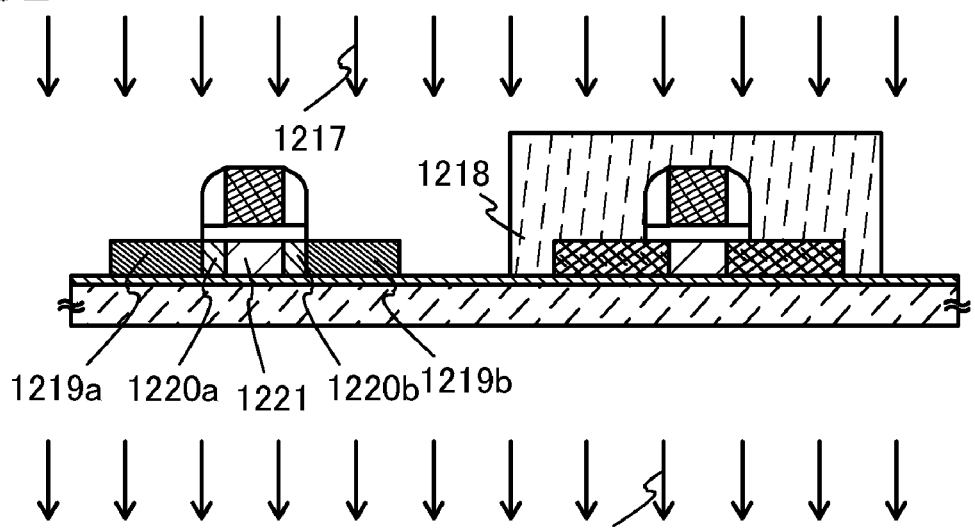
Figure 5C:
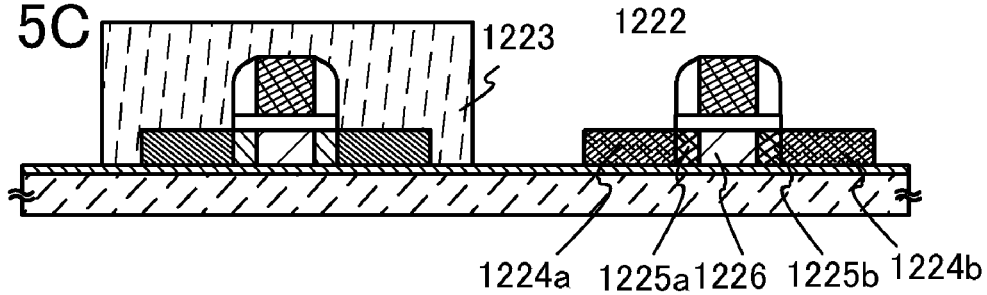

The mask 1214 is removed, and sidewall insulating layers 1216a to 1216d with a sidewall structure and gate insulating layers 1233a and 1233b are formed over respective side surfaces of the gate electrode layers 1208 and 1209 (see FIG. 5A). The sidewall insulating layers 1216a to 1216d with a sidewall structure may be formed over the side surfaces of the gate electrode layers 1208 and 1209 in a self-aligning manner, by forming an insulating layer that covers the gate electrode layers 1208 and 1209, and then processing the insulating layer by anisotropic etching by an RIE (Reactive Ion Etching) method. Here, although there is not particular limitation on the insulating layer, it is preferably made of silicon oxide with favorable step coverage that is formed by a reaction of tetra-ethyl-ortho-silicate (TEOS), silane or the like with oxygen, nitrous oxide, or the like. The insulating layer can be formed by a thermal CVD method, a plasma CVD method, an atmospheric pressure CVD method, a bias ECRCVD method, a sputtering method, or the like. The gate insulating layers 1233a and 1233b can be formed by etching the gate insulating layer 1207 using as masks the gate electrode layers 1208 and 1209 and the sidewall insulating layers 1216a to 1216d.

Further, in this embodiment, when etching the insulating layer, the insulating layer over the gate electrode layers are removed to expose the gate electrode layers; however, the sidewall insulating layers 1216a to 1216d may be formed to have a shape in which the insulating layer is left over the gate electrode layers. In addition, a protective film may be formed over the gate electrode layers in a later step. By protecting the gate electrode layers in this manner, film reduction of the gate electrode layers when etching is performed can be prevented. Furthermore, when silicide is formed in a source region and a drain region, since a metal film formed during silicide formation does not come into contact with the gate electrode layers, poor chemical reaction, diffusion, or the like can be prevented even if a material of the metal film and a material of the gate electrode layers are materials that easily react with each other. An etching method may be a dry etching method or a wet etching method, and various etching methods can be used. A dry etching method is used in this embodiment. As an etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used.

Next, a mask 1218 that covers the single crystal semiconductor layer 1206 is formed. An impurity element 1217 imparting n-type conductivity is added using as masks the mask 1218, the gate electrode layer 1208, and the sidewall insulating layers 1216a and 1216b, to form second n-type impurity regions 1219a and 1219b, and third n-type impurity regions 1220a and 1220b. In this embodiment, $PH_3$ is used as a doping gas containing an impurity element. Here, the impurity element imparting n-type conductivity is added so that the second n-type impurity regions 1219a and 1219b contain the impurity element at a concentration of about $5\times10^{19}$ atoms/$cm^3$ to $5\times10^{20}$ atoms/$cm^3$. Also, a channel-forming region 1221 is formed in the single crystal semiconductor layer 1205 (see FIG. 5B).

The second n-type impurity regions 1219a and 1219b are high-concentration n-type impurity regions, and serve as a source and a drain. On the other hand, the third n-type impurity regions 1220a and 1220b are low-concentration impurity regions, and serve as LDD (Lightly-Doped Drain) regions. Since the third n-type impurity regions 1220a and 1220b are formed in Loff regions which are not covered with the gate electrode layer 1208, off current can be reduced. As a result, a semiconductor device with higher reliability and lower power consumption can be manufactured.

Next, the mask 1218 is removed, and a mask 1223 that covers the single crystal semiconductor layer 1205 is formed. An impurity element 1222 imparting p-type conductivity is added using as masks the mask 1223, the gate electrode layer 1209, and the sidewall insulating layers 1216c and 1216d, to form second p-type impurity regions 1224a and 1224b, and third p-type impurity regions 1225a and 1225b.

The impurity element imparting p-type conductivity is added so that the second p-type impurity regions 1224a and 1224b contain the impurity element at a concentration of about $1\times10^{20}$ atoms/$cm^3$ to $5\times10^{21}$ atoms/$cm^3$. In this embodiment, the third p-type impurity regions 1225a and 1225b are formed in a self-aligning manner by the sidewall insulating layers 1216c and 1216d so as to have a lower concentration than the second p-type impurity regions 1224a and 1224b. In addition, a channel-forming region 1226 is formed in the single crystal semiconductor layer 1206 (see FIG. 5C).

The second p-type impurity regions 1224a and 1224b are high-concentration p-type impurity regions, and serve as a source and a drain. On the other hand, the third p-type impurity regions 1225a and 1225b are low-concentration impurity regions, and serve as LDD (Lightly-Doped Drain) regions. Since the third p-type impurity regions 1225a and 1225b are formed in Loff regions which are not covered by the gate electrode layer 1209, off current can be reduced. As a result, a semiconductor device with higher reliability and lower power consumption can be manufactured.

The mask 1223 is removed, and a heating treatment, strong light irradiation, or laser light irradiation may be performed to activate the impurity element. At the same time as the activation, plasma damage of the gate insulating layers and plasma damage at an interface between the gate insulating layers and the single crystal semiconductor layer can be restored.

Next, an interlayer insulating layer is formed over the substrate. In this embodiment, the interlayer insulating layer has a laminated structure of an insulating film 1227 containing hydrogen which serves as a protection film and an insulating layer 1228. Each of the insulating film 1227 and the insulating layer 1228 may be formed of a silicon nitride film, a silicon nitride oxide film, a silicon oxynitride film, or a silicon oxide film by a sputtering method or a plasma CVD method, or may be formed as a single layer or a laminated structure of 3 or more layers of another insulating film containing silicon.

Furthermore, a step of hydrogenating the single crystal semiconductor layer is carried out by performing a heat treatment for 1 hour to 12 hours at 300° C. to 550° C. in a nitrogen atmosphere. Preferably, the heat treatment is performed at 400° C. to 500° C. This step is a step for terminating a dangling bond of the single crystal semiconductor layer by hydrogen contained in the insulating film 1227, which is an interlayer insulating layer. In this embodiment, the heating treatment is performed for 1 hour at 410° C.

Alternatively, each of the insulating film 1227 and the insulating layer 1228 can be formed of a material selected from substances containing an inorganic insulating material, such as aluminum nitride (AlN), aluminum oxynitride (AlON), aluminum nitride oxide (AlNO) containing more nitrogen than oxygen, aluminum oxide, diamond-like carbon (DLC), nitrogen-containing carbon (CN), and polysilazane. Alternatively, a siloxane resin may be used. Note that siloxane resin corresponds to a resin that contains a Si—O—Si bond. A skeletal structure of siloxane is formed from a bond of silicon (Si) and oxygen (O). An organic group (for example, an alkyl group or an aryl group) or a fluoro group may be used as a substituent. The organic group may contain a fluoro group. Alternatively, an organic insulating material may be used, and polyimide, acrylic, polyamide, polyimide amide, resist, or benzocyclobutene can be used as an organic material. A coating film with favorable flatness that is formed by a coating method may be used as well.

The insulating film 1227 and the insulating layer 1228 can be formed by the following method or tool: dipping, spray coating, a doctor knife, a roll coater, a curtain coater, a knife coater, a CVD method, an evaporation method, or the like. The insulating film 1227 and the insulating layer 1228 may be formed by a droplet discharging method. When a droplet discharging method is used, a material solution can be economized. Alternatively, a method of transferring or depicting a pattern like the droplet discharging method, such as a printing method (a method by which a pattern in formed, such as screen printing or offset printing) can be used, for example.

Next, contact holes (openings) reaching the single crystal semiconductor layer are formed in the insulating film 1227 and the insulating layer 1228 using a mask made of a resist. Etching may be performed once or a plurality of times depending on selectivity of a material to be used. The insulating film 1227 and the insulating layer 1228 are removed by etching, and openings that reach the second n-type impurity regions 1219a and 1219b each serving as a source region or a drain region, and the second p-type impurity regions 1224a and 1224b are formed. The etching may be wet etching or dry etching, or both may be used. As an etchant used in wet etching, a hydrofluoric acid-based solution such as a mixed solution of ammonium hydrogen fluoride and ammonium fluoride may be used. As an etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used. Further, an inert gas may be added to the etching gas. As an inert element to be added, one or plural kinds of elements selected from He, Ne, Ar, Kr, and Xe can be used.

A conductive film is formed so as to cover the openings, and the conductive film is etched to form wiring layers 1229a, 1229b, 1230a, and 1230b each functioning as a source electrode layer or a drain electrode layer and are electrically connected to a portion of respective source regions and drain regions. The wiring layers can be formed by forming the conductive films by a PVD method, CVD method, an evaporation method, or the like, and then etching them into desired shapes. Further, the conductive layer can be selectively formed in a predetermined location by a droplet discharging method, a printing method, an electroplating method, or the like. Alternatively, a reflow method or a damascene method may also be used. A material of the wiring layers may be a metal such as Ag, Au, Cu, Ni, Pt, Pd, Ir, Rh, W, Al, Ta, Mo, Cd, Zn, Fe, Ti, Zr, Ba, or the like, Si, Ge, or an alloy or nitride thereof. In addition, a laminated structure of such materials may be used.

Figure 5D:
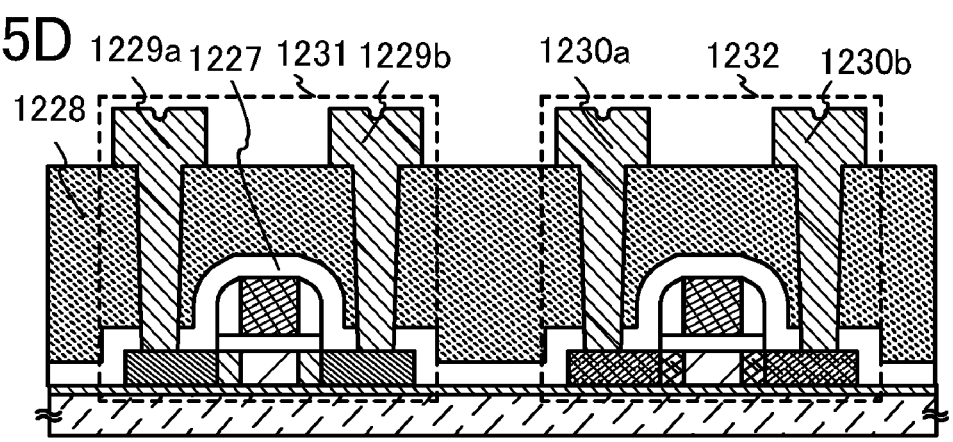

Through the above steps, a semiconductor device with a CMOS structure, which includes a transistor 1231 that is an n-channel thin film transistor and a transistor 1232 that is a p-channel thin film transistor, can be manufactured (see FIG. 5D). Although not illustrated, since a CMOS structure is described in this embodiment, the transistor 1231 and the transistor 1232 are electrically connected.

Without being limited to this embodiment, a transistor may have a single gate structure where one channel formation region is formed, a double gate structure where two channel formation regions are formed, or a triple gate structure where three channel formation regions are formed.

In the above manner, since a layer that is separated from a single crystal semiconductor substrate is used as a single crystal semiconductor layer, crystallinity is extremely high.

Thus, a semiconductor device that is thin and is high performance can be manufactured with high yield.

This embodiment can be appropriately combined with any one of Embodiments 1 and 2.

Embodiment 4

By applying the semiconductor device manufactured in Embodiment 3, the present invention can be applied to various electronic devices.

As those kinds of electronic devices, cameras such as video cameras and digital cameras; displays that can be mounted on a person's head (goggle-type displays); car navigation systems; projectors; car stereos; personal computers; portable information terminals (such as mobile computers, cellular phones, and electronic books); and the like can be given. Examples thereof are shown in FIGS. 6A to 6E.

Furthermore, the present invention can be applied to a semiconductor device or the like provided with a calculation function that can transmit and receive data without contact called a micro processor, an RFID tag, an ID tag, an IC tag, an IC chip, an RF tag, a wireless tag, an electronic tag, or a wireless chip.

Figure 6A:
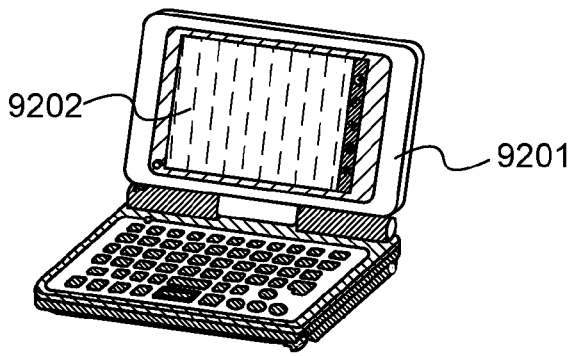
FIGS. 6A to 6E are diagrams illustration electronic devices.

A portable information terminal device shown in FIG. 6A includes a main body 9201, a display portion 9202, and the like. By applying the semiconductor device of Embodiment 3, a high performance and highly reliable portable information terminal device can be provided.

Figure 6B:
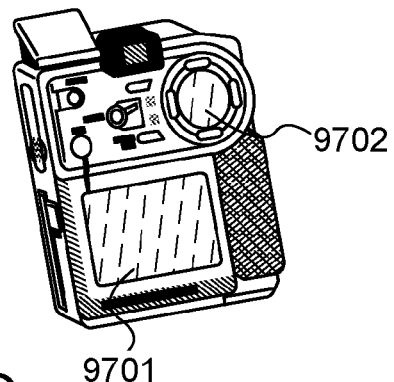

A digital video camera shown in FIG. 6B includes a display portion 9701, a display portion 9702, and the like. By applying the semiconductor device of Embodiment 3, a high performance and highly reliable digital video camera can be provided.

Figure 6C:
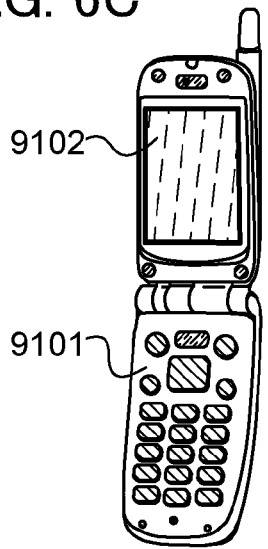

A cellular phone shown in FIG. 6C includes a main body 9101, a display portion 9102, and the like. By applying the semiconductor device of Embodiment 3, a high performance and highly reliable cellular phone can be provided.

Figure 6D:
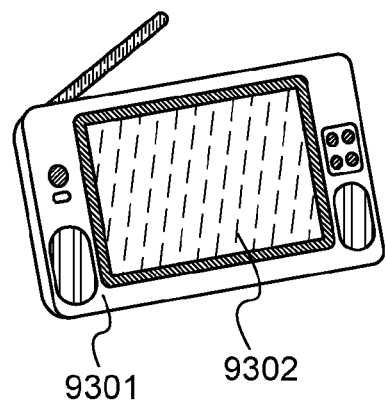

A portable television device shown in FIG. 6D includes a main body 9301, a display portion 9302, and the like. By applying the semiconductor device of Embodiment 3, a high performance and highly reliable portable television device can be provided. The semiconductor device of the present invention can be applied widely to various types of television devices including small-sized television incorporated in a portable terminal such as a cellular phone, a medium-sized television that can be carried around, and a large-sized television (for example, 40 inches or larger).

Figure 6E:
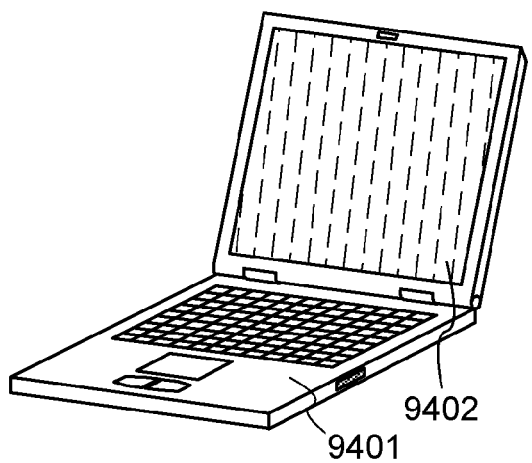

A portable computer shown in FIG. 6E includes a main body 9401, a display portion 9402, and the like. By applying the semiconductor device of Embodiment 3, a high performance and highly reliable portable computer can be provided.

This application is based on Japanese Patent Application serial no. 2010-084075 filed with Japan Patent Office on Mar. 31, 2010, the entire contents of which are hereby incorporated by reference.

What is claimed is:

1. A manufacturing method of a semiconductor substrate comprising:

emitting rare gas ions to a surface of a single crystal semiconductor substrate to form a first damaged region in the single crystal semiconductor substrate;

emitting a laser light to the surface of the single crystal semiconductor substrate to form a second damaged region with a portion of the first damaged region melted;

emitting hydrogen ions to the second damaged region through the surface of the single crystal semiconductor substrate to form an embrittled region at a certain depth from the surface of the single crystal semiconductor substrate; and performing a heat treatment to separate the single crystal semiconductor substrate at the embrittled region using the embrittled region to serve as a cleaved surface with the single crystal semiconductor substrate and a base substrate superimposed over each other in order to form a single crystal semiconductor layer over the base substrate from the single crystal semiconductor substrate.

2. The manufacturing method of a semiconductor substrate according to claim 1, wherein helium ions are used as the rare gas ions.

3. A manufacturing method of a semiconductor device, wherein a semiconductor element is formed using the single crystal semiconductor layer formed by the manufacturing method of a semiconductor substrate according to claim 1.

4. A manufacturing method of a semiconductor substrate comprising:

emitting rare gas ions to a surface of a single crystal semiconductor substrate to form a first damaged region in the single crystal semiconductor substrate;

emitting a first laser light to the surface of the single crystal semiconductor substrate to form a second damaged region with a portion of the first damaged region melted;

emitting hydrogen ions to the second damaged region through the surface of the single crystal semiconductor substrate to form an embrittled region at a certain depth from the surface of the single crystal semiconductor substrate;

emitting a second laser light to the surface of the single crystal semiconductor substrate to melt a region between the surface of the single crystal semiconductor substrate and the embrittled region; and performing a heat treatment to separate the single crystal semiconductor substrate at the embrittled region using the embrittled region to serve as a cleaved surface with the single crystal semiconductor substrate and a base substrate superimposed over each other in order to form a single crystal semiconductor layer over the base substrate from the single crystal semiconductor substrate.

5. The manufacturing method of a semiconductor substrate according to claim 4, wherein helium ions are used as the rare gas ions.

6. A manufacturing method of a semiconductor device, wherein a semiconductor element is formed using the single crystal semiconductor layer formed by the manufacturing method of a semiconductor substrate according to claim 4.

* * * * *